(12) United States Patent
Kita et al.

(10) Patent No.: US 8,446,736 B2
(45) Date of Patent: May 21, 2013

(54) CIRCUIT BOARD AND MANUFACTURING METHOD THEREOF

(75) Inventors: Takayuki Kita, Osaka (JP); Masaaki Katsumata, Osaka (JP); Tadashi Nakamura, Osaka (JP); Kota Fukasawa, Yamanashi (JP); Kazuhiro Furugoori, Yamanashi (JP)

(73) Assignee: Panasonic Corporation, Osaka (JP)

( * ) Notice: Subject to any disclaimer, the term of this patent is extended or adjusted under 35 U.S.C. 154(b) by 526 days.

(21) Appl. No.: 12/305,046

(22) PCT Filed: May 28, 2008

(86) PCT No.: PCT/JP2008/001324
§ 371 (c)(1),
(2), (4) Date: Dec. 16, 2008

(87) PCT Pub. No.: WO2008/146487
PCT Pub. Date: Dec. 4, 2008

(65) Prior Publication Data
US 2009/0175017 A1   Jul. 9, 2009

(30) Foreign Application Priority Data

May 29, 2007  (JP) ................................. 2007-141535
May 29, 2007  (JP) ................................. 2007-141536

(51) Int. Cl.
*H05K 1/11*  (2006.01)

(52) U.S. Cl.
USPC .......... 361/790; 361/704; 361/761; 361/763; 361/764; 361/804; 174/250; 174/256; 174/259; 174/260; 174/262; 257/678; 257/700; 257/724; 29/830; 29/840; 29/852; 438/107; 438/125; 438/698; 428/131; 428/206; 428/209

(58) Field of Classification Search
USPC .. 361/790, 704, 761, 763, 764, 804; 174/250, 174/254, 255, 256, 258–262; 257/678, 700, 257/706, 724; 29/830, 840, 852; 438/107, 438/125, 698; 428/131, 206, 209
See application file for complete search history.

(56) References Cited

U.S. PATENT DOCUMENTS 5,629,497 A * 5/1997 Sato et al. .................... 174/255
5,804,422 A * 9/1998 Shimizu et al. ............... 438/125

(Continued)

FOREIGN PATENT DOCUMENTS

EP    0 831 528 A2    3/1998
JP    04-369252 A    12/1992

(Continued)

OTHER PUBLICATIONS

Machine English translation for JP 2004-072124, previously submitted in IDS dated Dec. 16, 2008.

(Continued)

*Primary Examiner* — Xiaoliang Chen
(74) *Attorney, Agent, or Firm* — Pearne & Gordon LLP

(57) ABSTRACT

An upper board having an opening and forming a circuit on a surface layer, a connection sheet between boards having an opening and forming conductive holes filled with conductive paste in through-holes, and a lower board forming a circuit on a surface layer are stacked up, heated and pressed. In particular, the connection sheet between boards is made of a material different from the upper board and the lower board. A multi-layer circuit board having a cavity structure, and a full-layer IVH structure with high interlayer connection reliability can be manufactured.

5 Claims, 9 Drawing Sheets

U.S. PATENT DOCUMENTS

| | | | | |
|---|---|---|---|---|
| 5,905,634 | A * | 5/1999 | Takeda et al. | 361/704 |
| 6,005,289 | A * | 12/1999 | Watanabe et al. | 257/700 |
| 6,081,426 | A * | 6/2000 | Takeda et al. | 361/704 |
| 6,121,553 | A * | 9/2000 | Shinada et al. | 174/259 |
| 6,242,079 | B1 * | 6/2001 | Mikado et al. | 428/209 |
| 6,256,875 | B1 * | 7/2001 | Watanabe et al. | 29/830 |
| 6,261,671 | B1 * | 7/2001 | Asai et al. | 428/206 |
| 6,320,140 | B1 * | 11/2001 | Enomoto | 174/264 |
| 6,324,067 | B1 * | 11/2001 | Nishiyama | 361/761 |
| 6,376,052 | B1 * | 4/2002 | Asai et al. | 428/209 |
| 6,582,991 | B1 * | 6/2003 | Maeda et al. | 438/107 |
| 6,724,638 | B1 * | 4/2004 | Inagaki et al. | 361/763 |
| 6,762,921 | B1 * | 7/2004 | Asai et al. | 361/111 |
| 6,835,895 | B1 * | 12/2004 | Asai et al. | 174/255 |
| 6,948,944 | B2 * | 9/2005 | Ueno | 439/68 |
| 7,070,207 | B2 * | 7/2006 | Asai | 285/14 |
| 7,230,188 | B1 * | 6/2007 | En et al. | 174/257 |
| 7,332,816 | B2 * | 2/2008 | Hirose et al. | 257/776 |
| 7,361,849 | B2 * | 4/2008 | Asai et al. | 174/262 |
| 7,535,095 | B1 * | 5/2009 | En et al. | 257/701 |
| 2001/0003610 | A1 | 6/2001 | Nakatani et al. | 428/131 |
| 2001/0042637 | A1 * | 11/2001 | Hirose et al. | 174/255 |
| 2002/0189091 | A1 * | 12/2002 | Ding et al. | 29/840 |
| 2003/0015342 | A1 * | 1/2003 | Sakamoto et al. | 174/250 |
| 2003/0032729 | A1 * | 2/2003 | Takai et al. | 525/107 |
| 2003/0132025 | A1 * | 7/2003 | Wakihara et al. | 174/256 |
| 2003/0203171 | A1 * | 10/2003 | Higashitani | 428/209 |
| 2003/0207492 | A1 * | 11/2003 | Maeda et al. | 438/107 |
| 2004/0014317 | A1 * | 1/2004 | Sakamoto et al. | 438/689 |
| 2004/0025333 | A1 * | 2/2004 | Hirose et al. | 29/830 |
| 2004/0051172 | A1 * | 3/2004 | Miyazaki et al. | 257/700 |
| 2004/0074088 | A1 * | 4/2004 | Nakamura et al. | 29/831 |
| 2004/0112632 | A1 * | 6/2004 | Michiwaki et al. | 174/254 |
| 2004/0134682 | A1 * | 7/2004 | En et al. | 174/258 |
| 2004/0151883 | A1 * | 8/2004 | Higashitani | 428/209 |
| 2004/0151884 | A1 * | 8/2004 | Higashitani | 428/209 |
| 2004/0160751 | A1 * | 8/2004 | Inagaki et al. | 361/763 |
| 2004/0168825 | A1 * | 9/2004 | Sakamoto et al. | 174/260 |
| 2004/0202781 | A1 * | 10/2004 | Higashitani | 427/117 |
| 2004/0212030 | A1 * | 10/2004 | Asai | 257/432 |
| 2005/0023032 | A1 * | 2/2005 | Kawai et al. | 174/258 |
| 2005/0061544 | A1 * | 3/2005 | Nakakuki | 174/261 |
| 2005/0087850 | A1 * | 4/2005 | Nishikawa et al. | 257/678 |
| 2005/0121761 | A1 * | 6/2005 | Maeda et al. | 257/678 |
| 2005/0185880 | A1 * | 8/2005 | Asai | 385/14 |
| 2005/0186713 | A1 | 8/2005 | Akama et al. | |
| 2005/0258522 | A1 * | 11/2005 | En et al. | 257/670 |
| 2005/0284655 | A1 * | 12/2005 | Hsu et al. | 174/255 |
| 2006/0012967 | A1 * | 1/2006 | Asai et al. | 361/764 |
| 2006/0157865 | A1 * | 7/2006 | Hokari | 257/774 |
| 2006/0180344 | A1 * | 8/2006 | Ito et al. | 174/262 |
| 2006/0186536 | A1 * | 8/2006 | Hsu | 257/720 |
| 2006/0237225 | A1 * | 10/2006 | Kariya et al. | 174/260 |
| 2006/0261472 | A1 * | 11/2006 | Kimura et al. | 257/724 |
| 2006/0263003 | A1 * | 11/2006 | Asai et al. | 385/14 |
| 2007/0051695 | A1 * | 3/2007 | Asai et al. | 216/13 |
| 2007/0056767 | A1 * | 3/2007 | Asai | 174/262 |
| 2007/0062724 | A1 * | 3/2007 | Asai et al. | 174/255 |
| 2007/0062728 | A1 * | 3/2007 | Wakihara et al. | 174/262 |
| 2007/0062729 | A1 * | 3/2007 | Asai et al. | 174/262 |
| 2007/0095471 | A1 * | 5/2007 | Ito et al. | 156/293 |
| 2007/0119619 | A1 * | 5/2007 | Nakamura et al. | 174/262 |
| 2007/0137887 | A1 * | 6/2007 | Watanabe et al. | 174/256 |
| 2007/0209831 | A1 * | 9/2007 | Sakamoto et al. | 174/262 |
| 2007/0266546 | A1 * | 11/2007 | Yanagisawa | 29/592.1 |
| 2007/0266886 | A1 * | 11/2007 | En et al. | 106/1.18 |
| 2008/0170819 | A1 * | 7/2008 | Kodama et al. | 385/14 |
| 2008/0247703 | A1 * | 10/2008 | Kodama et al. | 385/14 |
| 2008/0247704 | A1 * | 10/2008 | Kodama et al. | 385/14 |
| 2008/0285910 | A1 * | 11/2008 | Yamada et al. | 385/14 |
| 2008/0289859 | A1 * | 11/2008 | Mikado et al. | 174/254 |
| 2009/0133915 | A1 * | 5/2009 | Higashitani | 174/261 |
| 2009/0154132 | A1 * | 6/2009 | Okamoto et al. | 361/804 |
| 2010/0170700 | A1 * | 7/2010 | Nakamura et al. | 174/254 |

FOREIGN PATENT DOCUMENTS

| | | | |
|---|---|---|---|
| JP | 08-097533 | A | 4/1996 |
| JP | 08-130372 | A | 5/1996 |
| JP | 09-199824 | A | 7/1997 |
| JP | 09-199856 | A | 7/1997 |
| JP | 09-232761 | A | 9/1997 |
| JP | 10-079446 | A | 3/1998 |
| JP | 10-154879 | A | 6/1998 |
| JP | 10-303553 | A | 11/1998 |
| JP | 11-017051 | A | 1/1999 |
| JP | 11-067965 | A | 3/1999 |
| JP | 2002-064271 | A | 2/2002 |
| JP | 2004-072124 | A | 3/2004 |
| JP | 2005-045150 | A | 2/2005 |
| JP | 2005-158923 | A | 6/2005 |
| JP | 2005-175115 | A | 6/2005 |
| JP | 2005-277387 | A | 10/2005 |
| JP | 2006-156432 | A | 6/2006 |
| JP | 2006-160899 | A | 6/2006 |
| JP | 2006-313932 | A | 11/2006 |
| JP | 2007-059844 | A | 3/2007 |

OTHER PUBLICATIONS

Machine English translation of JP 2006-156432, previously submitted in IDS dated Dec. 16, 2008.
Supplementary European Search Report for EP 08 76 3924 dated Feb. 17, 2011.
International Search Report for PCT/JP2008/001324.
Japanese Office Action for JP 2008-539173 dated Apr. 14, 2011.
Machine Translation and abstract of JP 2005-175115 A previously cited in an IDS filed on Dec. 16, 2008.

* cited by examiner

CIRCUIT BOARD AND MANUFACTURING METHOD THEREOF

TECHNICAL FIELD

The present invention relates to a manufacturing method of a circuit board of multiple layers having a cavity structure for mounting semiconductors and other components, and a circuit board.

BACKGROUND ART

Recently, as electronic appliances are becoming smaller in size and thickness, and higher in function, a high wiring accommodation capacity is demanded in a circuit board for composing an electronic circuit of an electronic appliance. In particular, to meet the need for higher mounting density, a multi-layer printed wiring board called mother board is further combined with a circuit board mounting semiconductors and other components.

In mounting of electronic components relating to small electronic devices such as portable telephone or digital still camera, or RF or other various modules and LED, in order to reduce the height of a circuit board after mounting electronic components, a multi-layer circuit board having a cavity structure is much expected, and various boards are developed, such as low temperature co-fired ceramic (LTCC) board, solid circuit board by resin forming, and multi-layer circuit board having cavity structure or component incorporating structure.

FIG. 10A is a sectional view of a conventional ceramic circuit board. The sectional structure of a conventional LTCC or other ceramic board is a multi-layer circuit board as shown in FIG. 10A, and green sheet 50 forming wiring conductors, or blanked holes or cavities as openings 55 in a ceramic board is laminated in a plurality, and fired and formed. In this case, usually, the low temperature co-fired ceramic board is fired at 900° C. or less, and the glass ceramic board is fired at 1000° C. or less.

FIG. 10B is a sectional view of a conventional resin-made circuit board. The conventional solid multi-layer circuit board by resin forming is as shown in FIG. 10B, and resin forming is generally achieved by forming mold resin layer 51 on lower substrate 52, heating and fusing the resin in a die or the like, and forming a wiring circuit on the surface by plating.

However, this ceramic board must be fired at high temperature near 900° C. even in the case of low temperature co-fired ceramics, and due to effects of shrinkage of green sheets, it is hard to assure the dimensional precision and the precision of the circuit. Further, including the formation of cavity structure, the manufacturing lead time is long, and the manufacturing cost is relatively high.

In the case of a multi-layer circuit board forming a cavity structure by resin forming, if through-holes are formed before forming, the through-holes may be deformed by flow of the resin when forming, and deterioration of insulation or short-circuiting between circuits may occur. Accordingly, in the technology of interlayer connection of forming all layers in inner via hole (IVH) structure, there were problems in process or structure. To solve the problems, after resin forming, non-through-holes or through-holes may be formed, and through-holes may be formed by conductive plating or by using conductive substance, but it is hard to process in the case of small holes, and it is hard to realize a very fine specification demanded recently.

Besides, the expansion coefficient of the ceramic board or circuit board by resin forming, and the expansion coefficient of mother board (multi-layer printed wiring board) for mounting a board are largely different in the value, there were various restrictions for mounting these boards on the mother board.

Hitherto, a plurality of circuit boards substantially made of same material as multi-layer printed wiring board as the mother board were laminated by way of an adhesion layer such as prepreg sheet, and a multi-layer circuit board having a cavity structure was developed. The prior art documents relating to the invention of the present application are disclosed in, for example, patent document 1 and patent document 2.

However, in the conventional multi-layer circuit board using the prepreg sheet, although the adhesion strength between circuit boards can be assured, the resin may flow out from the adhesion layer of prepreg sheet into the cavity when heating and pressing them, and defects may occur when mounting components in the cavities, and same as the circuit board by resin forming above, since the resin flow occurs, it was extremely difficult to connect all layers in IVH connection, both in structure and manufacturing process.

Patent document 1: Unexamined Japanese Patent Publication No. H9-199824
Patent document 2: Unexamined Japanese Patent Publication No. 2007-59844

DISCLOSURE OF THE INVENTION

The manufacturing method of a circuit board of the present invention includes a step of forming an upper board having openings in a board and forming a circuit on a surface layer, a step of forming a lower board having a circuit formed on the surface layer, a step of forming a connection sheet between boards having openings and having through-holes filled with conductive paste, and a step of laminating the lower substrate, the connection sheet between boards, and the upper board, and heating and pressing. The material of the connection sheet between boards has an adhesion layer containing an inorganic filler and a thermosetting resin, but not containing a core material formed on a carrier film. Hence, without resort to firing step or resin forming step, a circuit board forming convex cavities and having all-layer IVH structure of high connection reliability between layers can be manufactured efficiently.

In the configuration of the circuit board of the present invention, the openings of the connection sheet between boards are formed by laser processing, and the end face of the openings is a denatured layer formed of filler and deformed thermosetting resin, and thereby flow of resin from the end face of connection sheet between boards is prevented, and via inclination of through-holes and other deformation can be prevented, and further moisture absorption from outer field can be prevented. Hence, the electric insulation at high temperature and high humidity can be maintained (enhanced).

In the configuration of the circuit board of the present invention, moreover, an insulation coat film layer is formed at scattering spots as convex insulation coat film layer at the side laminating and adhering with the connection sheet between boards of the upper board and the lower board, and the convex insulation coat film layer is press-fitted into the adhesion layer of the connection sheet between boards, and the anchoring effect on the connection sheet between boards is enhanced, and flow of resin, and deformation of through-holes formed in the connection sheet between boards can be prevented, and the adhesion strength between layers of upper board and lower board can be further enhanced.

DESCRIPTION OF THE REFERENCE NUMERALS AND SIGNS

Figure 1A:
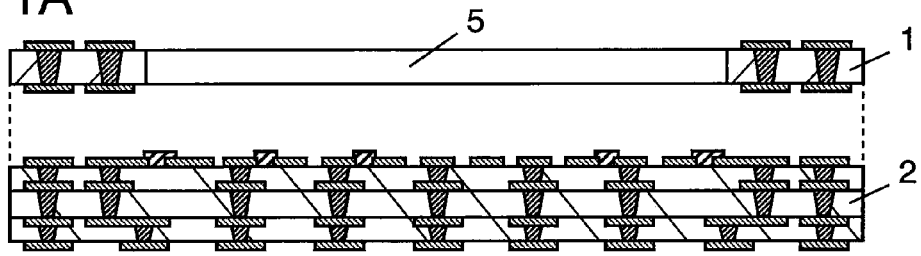
FIG. 1A is a sectional view of circuit board showing a manufacturing method of circuit board in preferred embodiment 1 of the present invention.

1 Upper board
2 Lower board
3 Connection sheet between boards
4, 41 Adhesion layer
5, 6, 9 Opening
7, 7a, 7b, 7c Solder resist
8 Cushion member
8a Parting layer
8b SUS plate
10, 20, 30 Circuit board
11 Cavity
12 Electronic component
13 Board
21, 31 Prepreg
22, 42a, 42b Parting film
23, 43 Through-hole
24, 34, 44 Conductive paste
25a, 25b, 35 Metal foil 26, 36 Circuit pattern
42 Carrier film
45 Contact portion

DETAILED DESCRIPTION OF THE PREFERRED EMBODIMENTS

Preferred Embodiment 1

Figure 1B:
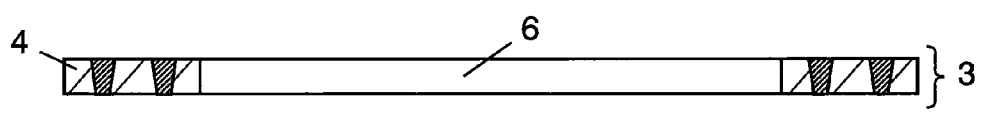
FIG. 1B is a sectional view of circuit board showing the manufacturing method of circuit board in preferred embodiment 1 of the present invention.

In this preferred embodiment, first, a basic structure of the present invention is explained, and then constituent elements of the present invention and other matters are described. FIG. 1E is a sectional view of a circuit board of the present invention. Upper board 1, which is a laminated board having cavities 11, is stacked up on lower board 2, which is also a laminated board.

First of all, a basic manufacturing process is explained. FIG. 1A to FIG. 1E, FIG. 2, and FIG. 2B are sectional view of the circuit board for explaining the manufacturing method of circuit board in preferred embodiment 1 of the present invention. First, as shown in FIG. 1A, upper board 1 and lower board 2 forming circuits on surface layer are manufactured and prepared. Both upper board 1 and lower board 2 have conductive holes formed by filling through-holes 23 with conductive paste 24, and the circuits on both surface layers are connected between layers by way of conductive holes. Next, as shown in FIG. 1B, connection sheet 3 between boards is manufactured and prepared by filling through-holes with conductive paste 24. At this time, connection sheet 3 between boards is in B-stage state, that is, the insulating resin is half cured.

Upper board 1 and connection sheet 3 between boards respectively have opening 5 and opening 6 of a specific area formed in a region including the central portion. Connection sheet 3 between boards having adhesion layer 4 is made of a material different from that of upper board 1 and lower board 2. Connection sheet 3 between boards has conductive holes formed by filling through-holes formed in board material in B-stage state with conductive paste, and functions to adhere the board and connect the layers electrically. The structure of upper board 1, lower board 2, and connection sheet 3 between boards, and the detail of manufacturing method for manufacturing them are described later.

Figure 1C:
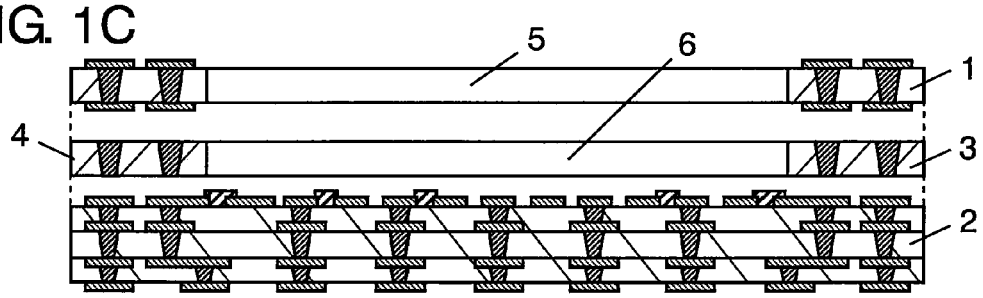
FIG. 1C is a sectional view of circuit board showing the manufacturing method of circuit board in preferred embodiment 1 of the present invention.
Figure 1D:
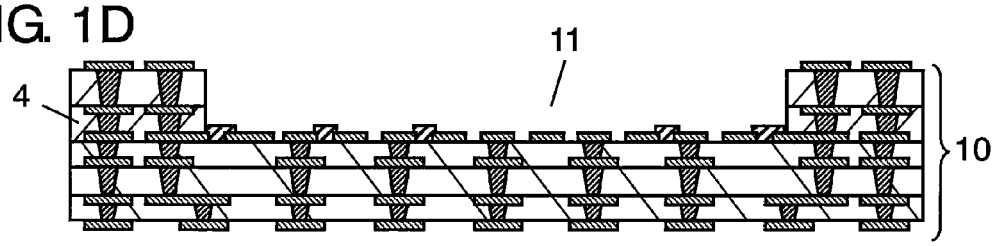
FIG. 1D is a sectional view of circuit board showing the manufacturing method of circuit board in preferred embodiment 1 of the present invention.
Figure 1E:
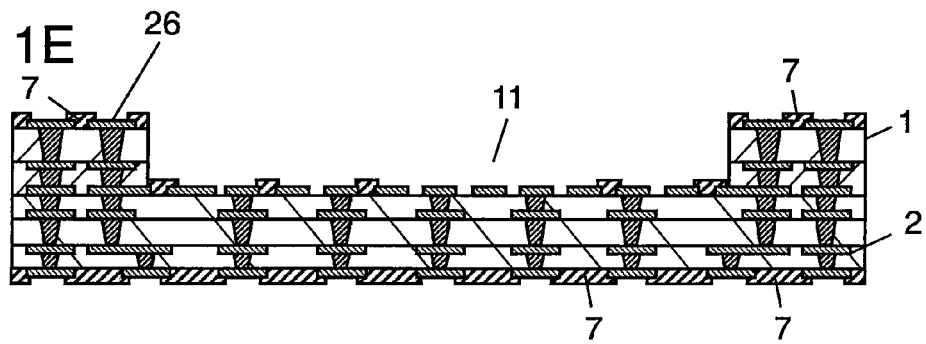
FIG. 1E is a sectional view of circuit board showing the manufacturing method of circuit board in preferred embodiment 1 of the present invention.

As shown in FIG. 1C, lower board 2, connection sheet 3 between boards, and upper board 1 are laminated sequentially, and heated and pressed (vacuum heat press), and formed and cured, and lower board 2 and upper board 1 are adhered by way of connection sheet 3 between boards, and multi-layer circuit board 10 is formed as shown in FIG. 1D. Opening 5 of upper board 1 and opening 6 of connection sheet 3 between boards are formed nearly in same size at corresponding upper and lower positions, and a portion of cavity 11 is formed in circuit board 10.

As shown in FIG. 1E, solder resist 7 is selectively formed as insulation coat film layer in a region excluding partial circuit patterns such as connection electrodes on the surface of upper board 1 and lower board 2, and the exposed conductor is plated with nickel or gold. That is, the step of forming selectively the insulation coat film layer in a region excluding a part on the surface of upper board 1 and lower board 2 is followed by a step of forming a gold plating layer on the exposed surface.

In this example, solder resist 7 is formed at the step shown in FIG. 1E, but it may be also formed at a preparatory step in FIG. 1A. The detail is explained later.

Figure 2A:
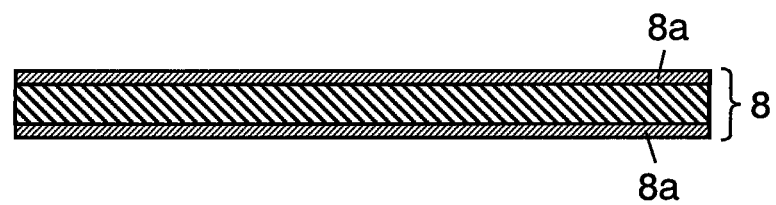
FIG. 2A is a sectional view of circuit board showing the manufacturing method of circuit board in preferred embodiment 1 of the present invention.
Figure 2B:
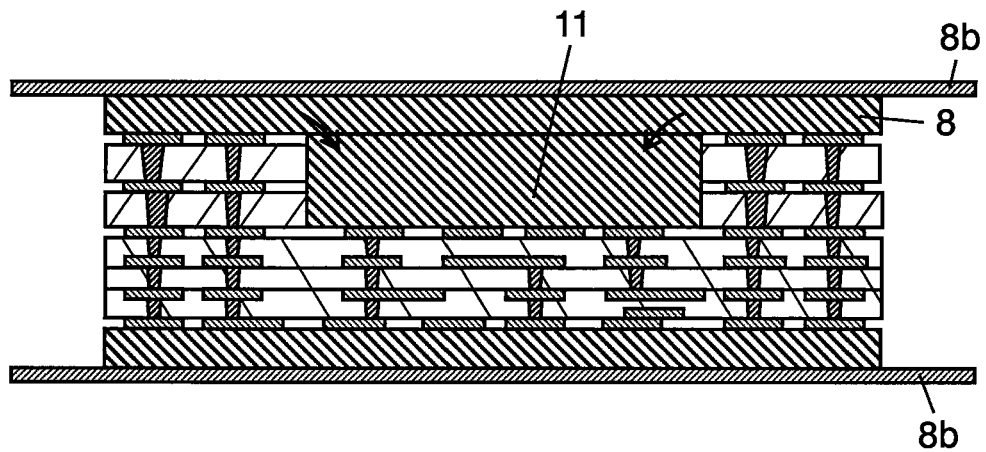
FIG. 2B is a sectional view of circuit board showing the manufacturing method of circuit board in preferred embodiment 1 of the present invention.

The step of heating and pressing by heat press in FIG. 1C is preferably conducted by holding with SUS plate 8b shown in FIG. 2B, by way of cushion member 8 shown in FIG. 2A, especially at the upper side, because openings 5, 6 are present. As cushion member 8, silicone rubber or butyl rubber having parting layer 8a on the surface layer is suited.

Cushion material 8 is fluidized in the process of temperature elevation by vacuum heat press device, and is pressed and injected into hollow part (cavity 11) of openings 5, 6, as shown in FIG. 2B, and the entire surface of laminate layers is uniformly pressurized. Besides, between parting layer 8a and the silicone rubber or butyl rubber, a cushion member having a fluid material may be used. It is also possible to heat and press by using a die having a convex portion of nearly same volume as the volume of openings 5, 6.

Figure 3A:
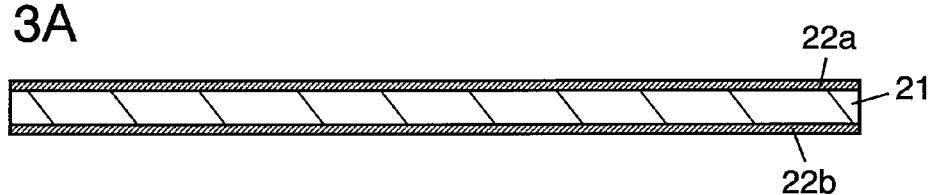
FIG. 3A is a sectional view of circuit board showing the manufacturing method of upper board in preferred embodiment 1 of the present invention.

Secondly, the structure of upper board 1 prepared at the step in FIG. 1A and the process are explained. FIG. 3A to FIG. 3F, and FIG. 4A to FIG. 4C are sectional views of circuit board for explaining the manufacturing method of the upper board in preferred embodiment 1 of the present invention. In FIG. 3A, reference numeral 21 is a prepreg sheet (or called prepreg) as board material in B-stage state measuring 300 by 250 mm, and about 100 μm in thickness, and, for example, a compound material of glass woven fabric as base material impregnated with thermosetting epoxy resin is used, and it is also used in a printed wiring board known as mother board. Parting films 22a, 22b are plastic sheets of about 12 μm in thickness having one side coated with Si compound parting agent, and, for example, polyethylene terephthalate is used.

Figure 3B:
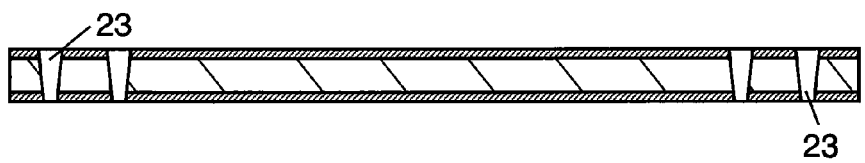
FIG. 3B is a sectional view of circuit board showing the manufacturing method of upper board in preferred embodiment 1 of the present invention.
Figure 3C:
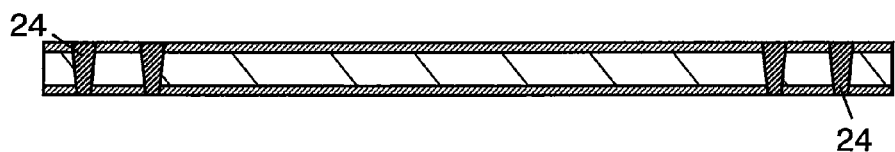
FIG. 3C is a sectional view of circuit board showing the manufacturing method of upper board in preferred embodiment 1 of the present invention.

As shown in FIG. 3B, through-holes 23 are formed by laser processing or other method at specified positions of prepreg 21 adhered with parting films 22a, 22b on both sides. As shown in FIG. 3C, through-holes 23 are filled with conductive paste 24. The filling method is direct printing of conductive paste 24 on parting films 22 by using a printing press (not shown). At this time, parting films 22 play the role of printing mask, and the role of preventing contamination of surface of prepreg 21.

Figure 3D:
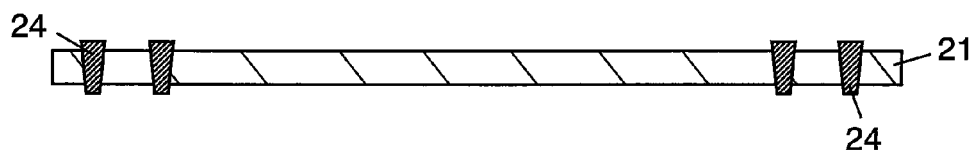
FIG. 3D is a sectional view of circuit board showing the manufacturing method of upper board in preferred embodiment 1 of the present invention.
Figure 3E:
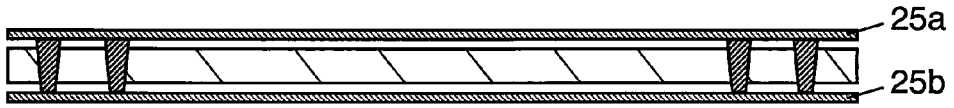
FIG. 3E is a sectional view of circuit board showing the manufacturing method of upper board in preferred embodiment 1 of the present invention.
Figure 3F:
FIG. 3F is a sectional view of circuit board showing the manufacturing method of upper board in preferred embodiment 1 of the present invention.

As shown in FIG. 3D, parting films 22 are parted from both sides of prepreg 21. As shown in FIG. 3E, prepreg 21 is laminated by holding with metal foils 25a, 25b. As shown in FIG. 3F, the entire surface is heated and pressed by a heat press, and prepreg 21 is cured. At this time, conductive paste 24 is compressed, and metal foil 25a and metal foil 25b of both sides are connected electrically.

Figure 4A:
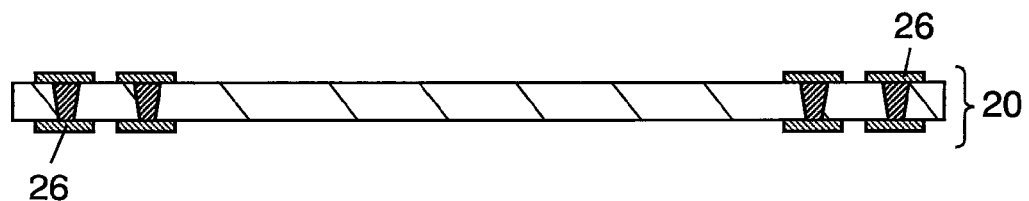
FIG. 4A is a sectional view of circuit board showing the manufacturing method of upper board in preferred embodiment 1 of the present invention.
Figure 4B:
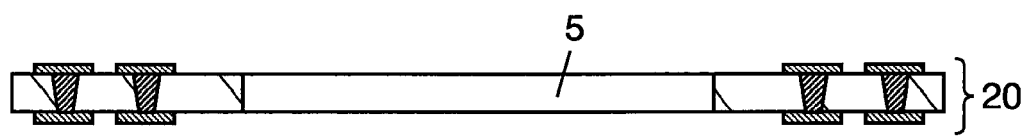
FIG. 4B is a sectional view of circuit board showing the manufacturing method of upper board in preferred embodiment 1 of the present invention.

Next, as shown in FIG. 4A, metal foil 25a and metal foil 25b such as copper foils are selectively etched, and two-layer circuit board 20 forming circuit patterns 26 is obtained. As shown in FIG. 4B, opening 5 of specific area (10 mm×10 mm) is formed in a region including the central portion. The forming method of opening 5 includes a method of cutting and removing by laser processing after selectively etching central metal foils 25a, 25b at the step in FIG. 4A, a method of blanking by using a die, and a method of router processing by using an end mill.

Figure 4C:
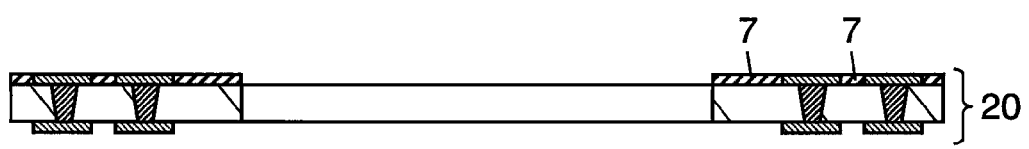
FIG. 4C is a sectional view of circuit board showing the manufacturing method of upper board in preferred embodiment 1 of the present invention.

Upper board 1 forming opening 5 may be also prepared at the step in FIG. 1A, but more preferably, as shown in FIG. 4C, solder resist 7 is formed on upper board 1 as insulation coat film, and it is laminated at the step in FIG. 1C. The merit of this method is that the solder resist is formed while upper board 1 is in flat state, and thereby it is easy in manufacturing process and high in productivity, and moreover the following modes can be employed.

Figure 4D:
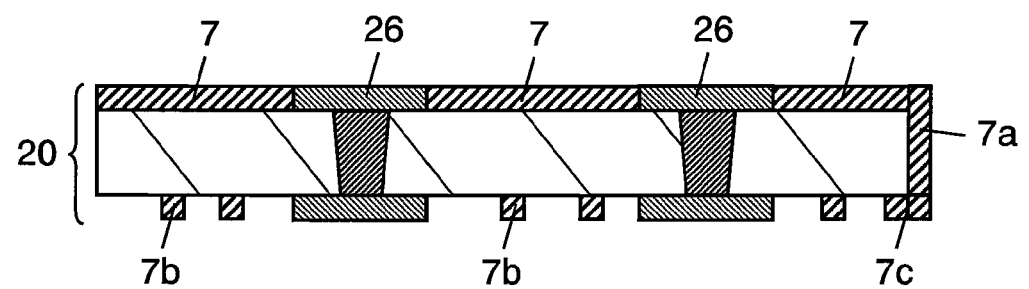
FIG. 4D is a sectional view of circuit board showing the manufacturing method of upper board in preferred embodiment 1 of the present invention.

FIG. 4D is a essentially magnified sectional view. As shown in the diagram, (photo) solder resist 7 of photographic development type is formed as insulation coat film layer in nearly entire region excluding circuit patterns 26 such as connection electrodes at the upper side in the diagram of circuit board 20 as upper board 1. The function as the circuit board is achieved at least by forming solder resist 7, but it is further preferred to form solder resist 7a also at the end face of opening 5. The solder resist can be applied to the end face of opening 5 by electrostatic coating, roll coater, dip coater, and other methods.

On the surface contacting with connection sheet 3 between boards (lower side in the diagram), convex solder resists 7b of about 50 to 100 µm in diameter are scattered in the portions not forming conductive holes of connection sheet 3 between boards. Further, in a specific range from the end of opening 5, solder resist 7c is formed. Solder resist 7a prevents moisture absorption from the end face, and prevents dust formed from the end face of the board material. Solder resist 7b prevents the anchoring effect on connection sheet 3 between boards and deformation of conductive holes formed in connection sheet 3 between boards, and prevents flow-out of resin of connection sheet 3 between boards together with solder resist 7c.

The above explanation is about upper board 1 (lower side in the diagram/contact surface), and it is preferred to form convex solder resist 7b also on the surface contacting with connection sheet 3 between boards of lower board 2. However, solder resist 7c is not needed when opening is not provided in lower board 2.

By this solder resist 7b, it is possible to cope with deformation of connection sheet 3 between boards due to difference in thermal expansion of upper board 1 and lower board 2 at the step in FIG. 1C, and the conductive connection of upper board 1 and lower board 2 can be maintained. In particular, in connection sheet 3 between boards not containing padding of woven fabric or non-woven fabric, the presence of convex solder resist 7b is effective, and the effect can be enhanced by forming in a smaller diameter than the circuit pattern diameter for conductive land, and the presence of convex solder resist 7b contributes to enhancement of bonding strength of connection sheet 3 between boards and upper board 1 and lower board 2.

In FIG. 4D, solder resist 7 at the upper in the diagram is formed in a proper amount of exposure, but solder resist 7b at the lower side in the diagram is preferably formed in an over-exposure condition. As a result, convex solder resist 7b can be formed in trapezoidal or wedge shape. Therefore, convex solder resist 7b is press-fitted into the adhesive layer of connection sheet 3 between boards, and the firm and biting anchoring effect is further enhanced.

Adhesion layer 4 for composing connection sheet 3 between boards is low in fluidity, and upper board 1 and lower board 2 are completely cured boards in C-stage state, and the inter-layer bonding strength must be further enhanced. In this case, by using similar materials for the resin for forming convex solder resist 7b and the resin of adhesion layer 4, it is further effective for the bonding strength.

Usually, the forming step of solder resist is final curing or post UV curing step by heating after exposing and developing steps, but the solder resist in the preferred embodiment may be developed only after exposure, and cured together with connection sheet 3 between boards and upper board 1 and lower board 2 at the step of heat press. The merit in this case is that the fusing bond of the resin in the adhesion layer 4 and the resin component in the convex solder resist can be enhance, and when the resins are similar materials, in particular, the inter-layer bonding strength is further enhanced.

Figure 5D:
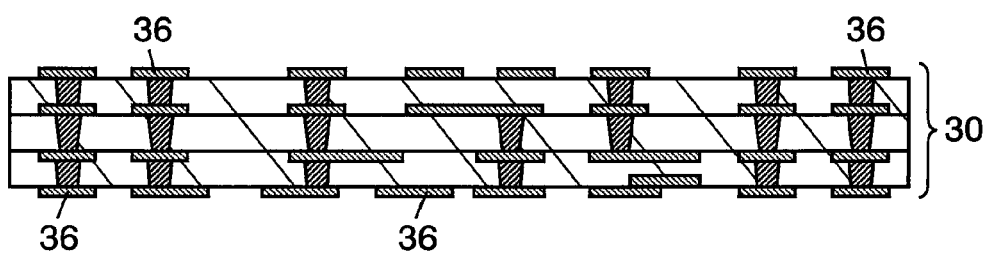
FIG. 5D is a sectional view of circuit board showing the manufacturing method of lower board in preferred embodiment 1 of the present invention.
Figure 6A:
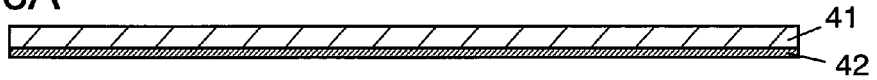
FIG. 6A is a sectional view of circuit board showing the manufacturing method of connection sheet in preferred embodiment 1 of the present invention.

The structure of lower board 2 and the manufacturing process are explained. That is, the structure of lower board 2 prepared at the step in FIG. 1A and the process are explained below. FIG. 6A to FIG. 5D are sectional views of the lower board for showing the manufacturing method.

Figure 5A:
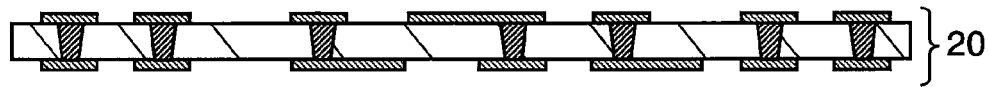
FIG. 5A is a sectional view of circuit board showing the manufacturing method of lower board in preferred embodiment 1 of the present invention.
Figure 5B:
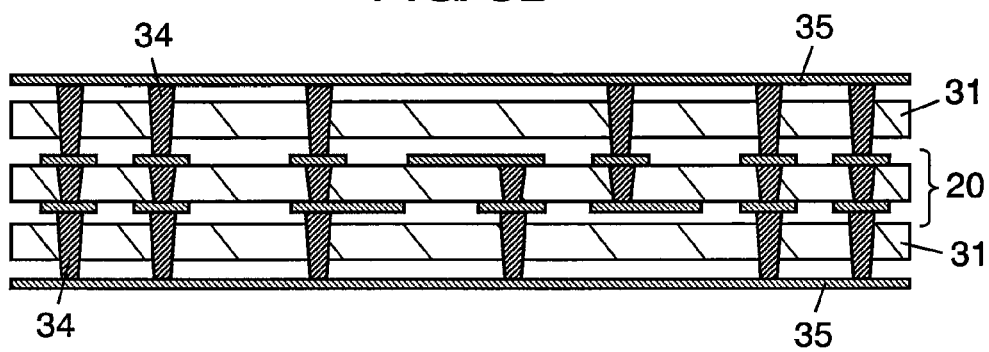
FIG. 5B is a sectional view of circuit board showing the manufacturing method of lower board in preferred embodiment 1 of the present invention.

First, as shown in FIG. 5A, two-layer circuit board 20 formed at steps in FIG. 3A to FIG. 3F and FIG. 4A to FIG. 4D is prepared. Next, two sheets of prepreg 31 and two sheets of metal foil 35 manufactured in the manufacturing method shown in FIG. 3A to FIG. 3D are prepared. On a positioning stage (not shown), as shown in FIG. 5B, metal foils 35 and prepregs 31 are placed, and circuit board 20 is further stacked up as core board for inner layer, and further metal foils 35 and prepregs 31 are laminated. They are bonded temporarily and fixed, and a laminated structure is obtained.

Figure 5C:
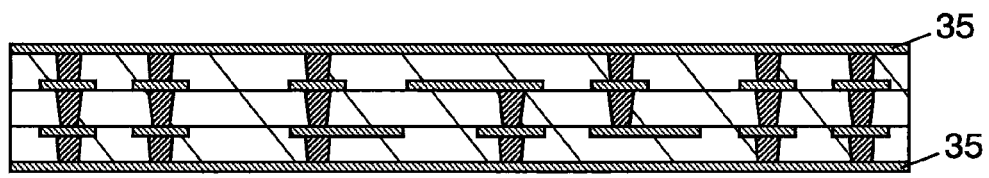
FIG. 5C is a sectional view of circuit board showing the manufacturing method of lower board in preferred embodiment 1 of the present invention.

As shown in FIG. 5C, this laminated structure is heated and pressed on the whole surface by heat press, and formed and cured, and metal foils 35 and prepregs 31 and circuit board 20 are adhered, and a multi-layer structure is formed. At this time, conductive paste 34 is compressed, and surface and reverse metal foils 35 are electrically connected to the circuit patterns of circuit board 20 of inner layer by way of conductive paste 34. As shown in FIG. 5D, by selectively removing metal foils 35 by etching or other process, circuit pattern 36 is formed, and four-layer circuit board 30 is completed.

To laminate in more than four layers, the same step may be repeated by using a circuit board of more than four layers as the core board for inner layer.

In other example, two sheets of multi-layer wiring board having a circuit on surface layer or both layers (including the circuit board of the present invention) may be used as a multi-layer circuit board by way of prepreg having conductive holes for inter-layer connection filled with conducive paste in through-holes.

Moreover, the circuit of surface layer may be inter-layer connected with circuit board 10 of inner layer as core board by way of conductive holes formed by conductive plating, and a multi-layer wiring board may be composed. The inner board as core board may be connected between surface and reverse sides or between layers by conductive holes formed by conductive plating. In particular, by using a board having through-holes or plated through-holes, the cooling effect may be enhanced.

The structure of connection sheet 3 between boards and the process are explained. That is, the structure of connection sheet 3 between boards prepared at the step in FIG. 1B and the process are explained. FIG. 6A to FIG. 6H are sectional views of connection sheet 3 between boards for showing the manufacturing method.

As shown in FIG. 6A, a sheet material measuring 300 by 250 mm forming adhesion layer 41 of (multifunctional) organic system in a thickness of about 100 µm on carrier film 42 is prepared. The thickness of adhesion layer 41 may be properly selected from the range of 30 to 300 µm. The present inventor has tested at 50 µm, 100 µm, and 200 µm, and depending on the height of mounted components, in this preferred embodiment, the thickness of adhesion layer 41 is shown at about 100 µm.

The sheet material is composed by forming a thermosetting resin layer filled filler at high filling rate as adhesion layer 41 on PET (polyethylene terephthalate) as carrier film 42, and the filler is specifically powder of silica, alumina, other inorganic matter mixed with 55 to 90 wt. % of epoxy resin, and glass woven fabric or other base material is not used as padding.

Accordingly, the coefficient of thermal expansion of sheet material in longitudinal, lateral or thickness direction is lower than the coefficient of thermal expansion of ordinary glass epoxy laminated plate, and in particular in a lower state than the glass transition temperature in thickness direction of sheet material of the preferred embodiment, expansion coefficient $\alpha 1$ is 12 ppm/° C., and in the prepreg sheet of glass cloth epoxy resin of the material of upper board 1 and lower board 2, expansion coefficient α 1 in thickness direction is 65 ppm/° C. The sheet material is low in fluidity because the filler is contained at high filling rate, and to keep low fluidity, if necessary, a rubber material may be properly mixed.

Figure 6B:
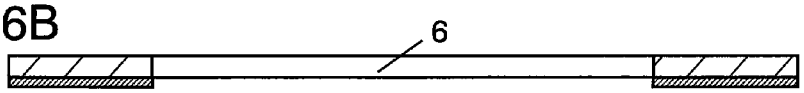
FIG. 6B is a sectional view of circuit board showing the manufacturing method of connection sheet in preferred embodiment 1 of the present invention.

Next, as shown in FIG. 6B, opening 6 of specific area is formed in a region including the central portion of the sheet material. Preferably, opening 6 is formed while carrier film 42 is present in consideration of handling performance in the manufacturing step. Opening 6 can be formed by blanking a die, but is preferably formed by removing and cutting by laser process. Adhesion layer 41 in the preferred embodiment is mainly made of epoxy resin, and when silica or alumina is contained by 55 wt. % or more as filler content, by removing and cutting by using carbon dioxide laser of wavelength of 9.4 to 10.6 µm, flow of resin at the cut section can be suppressed. Its mechanism is to modify the epoxy by absorbing the processing energy of laser by the filler in adhesion layer 41 to be converted into heat, and to form the modified layer composed of the filler as the core and the modified thermosetting resin along the cut section.

Hence, when heating and pressing at the step in FIG. 1D, flow of resin from the end of connection sheet 3 between boards can be prevented, and via collapse or deformation of conductive holes can be prevented. The cut section can prevent moisture absorption from outside by modifying the processed surface by laser processing heat. Accordingly, the electric insulating performance at high temperature and high humidity can be maintained or heightened. Further, generation of refuse due to dropping of filler or resin components from the end face of opening 6 can be prevented.

The area of opening 6 is desired to be larger than the area of opening 5 of upper board 1 formed at the step in FIG. 4B. When opening 5 is a square of side A (mm), opening 6 is a square of side A+a (mm), and the value of "a" is desired to be set at 0.5 to 1.0% of A. For example, opening 5 is a square of side of 10 mm, opening 6 is wider than opening 5 in a range of 50 to 100 µm. As a result, a sufficient clearance is assured for preventing flow-out of resin of connection sheet 3 between boards, and by fitting to solder resist 7c formed at the end of opening 5 of upper board 5, flow-out of resin of connection sheet 3 between boards can be prevented.

Figure 6C:
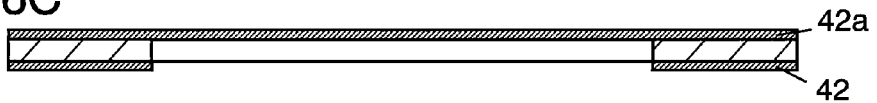
FIG. 6C is a sectional view of circuit board showing the manufacturing method of connection sheet in preferred embodiment 1 of the present invention.

Further, as shown in FIG. 6C, parting film 42a is laminated to the opposite side of carrier film 42 of sheet material. Parting film 42a may be also laminated on both sides including the surface of carrier film 42 of sheet material, but in this preferred embodiment, it is laminated on one side. Parting film 42a is a plastic sheet of about 12 µm in thickness coated with Si parting agent on one side, and, for example, polyethylene terephthalate is used.

Figure 6D:
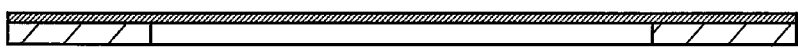
FIG. 6D is a sectional view of circuit board showing the manufacturing method of connection sheet in preferred embodiment 1 of the present invention.
Figure 6E:
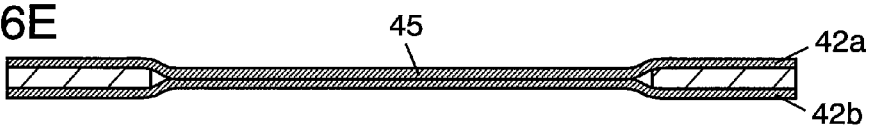
FIG. 6E is a sectional view of circuit board showing the manufacturing method of connection sheet in preferred embodiment 1 of the present invention.

As shown in FIG. 6D, film carrier 42 is parted. As shown in FIG. 6E, parting film 42b is laminated to the peeled surface of carrier film 42 in vacuum state by using a vacuum laminating device, and contact portion 45 contacting parting films 42a, 42b is formed at opening 6 as shown in the diagram.

The vacuum laminating device has a laminating roll (not shown), and parting films 42a, 42b can be laminated to the sheet material while heating and pressing. At this time, in this preferred embodiment, being laminated in vacuum state, contact portion 45 of parting film sinks into opening 6, and this portion is not heated or pressed by the laminating roll, and the state contacting only by vacuum pressure can be maintained. As a result, at the subsequent step shown in FIG. 6H, parting films 42a, 42b can be peeled easily.

Moreover, since contact portion 45 is provided in opening 6, the rigidity of adhesion layer 41 can be enhanced, and it is easy to handle the sheet material in later steps of laser hole processing or paste filling.

In this example, the vacuum laminating device is provided with the laminating roll, but by using a vacuum press device, the parting film can be laminated to the sheet material. In this case, too, when operated in vacuum state, contact portion 45 may be provided in opening 6.

In FIG. 6D, after once parting carrier film 42, parting film 42b is laminated at the step in FIG. 6E, and the purpose of this step is to form contact portion 45 after vacuum laminating. Aside from enhancing the handling performance mentioned above, in the later process of laser processing, the most preferred condition is obtained for laser processing, and parting films 42a, 42b of same material are laminated on both sides.

Figure 6F:
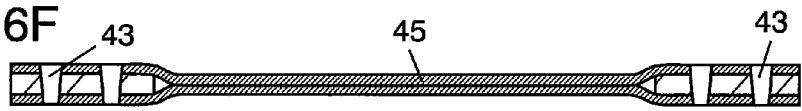
FIG. 6F is a sectional view of circuit board showing the manufacturing method of connection sheet in preferred embodiment 1 of the present invention.
Figure 6G:
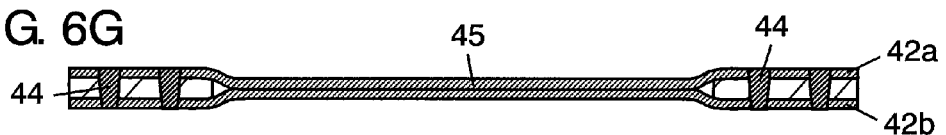
FIG. 6G is a sectional view of circuit board showing the manufacturing method of connection sheet in preferred embodiment 1 of the present invention.
Figure 6H:
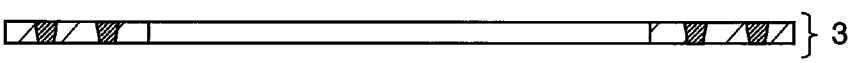
FIG. 6H is a sectional view of circuit board showing the manufacturing method of connection sheet in preferred embodiment 1 of the present invention.

As shown in FIG. 6F, through-holes 43 are formed in a region excluding opening 6 by laser processing method. As shown in FIG. 6G, through-holes 43 are filled with conductive paste 44. The filling method is same as at step in FIG. 3C. As shown in FIG. 6H, parting films 42a, 42b are parted from upper and lower sides of sheet material, and connection sheet 3 between boards is completed.

Figure 7A:
FIG. 7A is a sectional view of circuit board showing the manufacturing method of connection sheet in preferred embodiment 1 of the present invention.
Figure 7B:
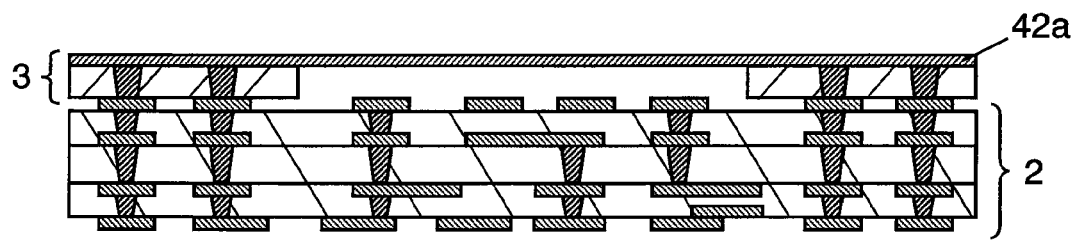
FIG. 7B is a sectional view of circuit board showing the manufacturing method of circuit board in preferred embodiment 1 of the present invention.

In the explanation so far, upper board 1 and lower board 2 are laminated by way of completed connection sheet 3 between boards as shown in FIG. 1, but a slightly different method may be also employed. FIG. 7A and FIG. 7B are sectional views of circuit board for explaining a different manufacturing method of connection sheet in preferred embodiment 1 of the present invention. As shown in the sectional view of connection sheet in FIG. 7A, only reverse side parting film 42b is parted, and parting film 42a remains laminated on the surface side, and connection sheet 3 between boards is prepared in this state. Next, as shown in FIG. 7B, the opposite side having parting film 42a is the contact surface, and connection sheet 3 between boards is positioned and laminated on lower board 2, and plural spots are bonded temporarily. Afterward, in vacuum state, the entire surface is bonded temporarily by laminating in vacuum state.

The purpose of this manufacturing method is to prevent position deviation because there is such possibility at the step of heat press in temporary bonding at plural spots because connection sheet 3 between boards of the preferred embodiment is low in fluidity and high in rigidity. By the presence of parting film 42a, the state of the filled conductive paste may bee maintained, and the entire surface of connection sheet 3 between boards including the end portion of opening 6 can be uniformly bonded temporarily to lower board 2. Later, parting film 42a is removed, and upper board 1 is laminated on connection sheet 3 between boards, and a circuit board is completed in the same steps as the steps shown in FIG. 1D and after.

Aside from the method of temporarily bonding the entire surface by vacuum laminating, it is also possible to bond temporarily on the entire surface uniformly by heat press. In this case, parting film 42a functions to protect the contained conductive paste, and also plays the role as parting film at the time of heat pressing.

The structure of connection sheet 3 between boards may be also composed by forming resin layers of 1 to 2 µm on the surface layer. In this configuration, a three-layer sheet material of resin layer, adhesion layer 41 and resin layer is prepared on carrier film 42, and formed in same steps as shown in FIG. 6A to FIG. 6H. Using the parting film having the resin layer, at steps in FIG. 6C to FIG. 6E, the resin layer can be transferred on the side of adhesion layer 41 by heating and pressing.

In this configuration, the bonding strength of connection sheet 3 between boards, and upper board 1 and lower board 2 can be enhanced. In particular, when the resin layer is a same resin material for forming the board material of upper board 1 and lower board 2, the effects are further enhanced. By combining this configuration with the configuration of convex solder resist 7c mentioned above, the effects may be enhanced further more.

Preferred Embodiment 2

Figure 8A:
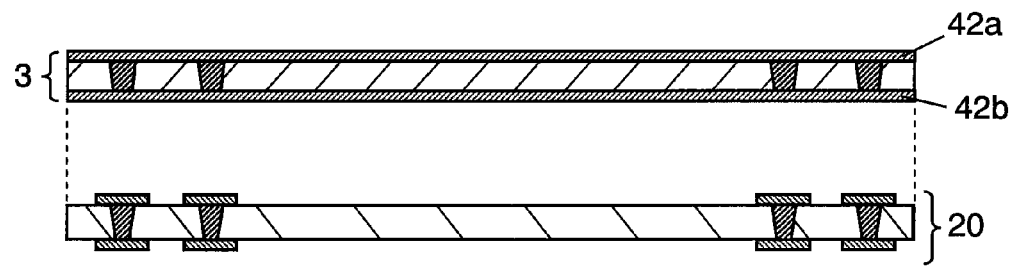
FIG. 8A is a sectional view of circuit board showing a manufacturing method of circuit board in preferred embodiment 2 of the present invention.
Figure 8B:
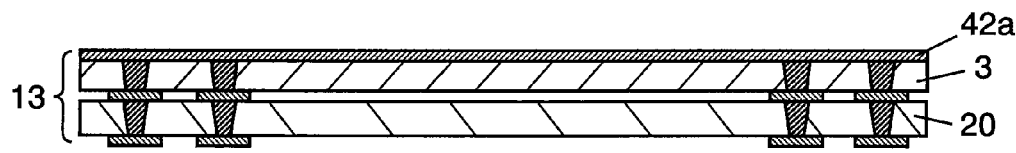
FIG. 8B is a sectional view of circuit board showing the manufacturing method of circuit board in preferred embodiment 2 of the present invention.
Figure 8C:
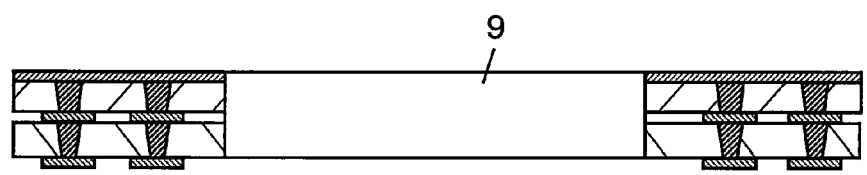
FIG. 8C is a sectional view of circuit board showing the manufacturing method of circuit board in preferred embodiment 2 of the present invention.

A manufacturing method of circuit board in preferred embodiment 2 of the present invention is described below. In this preferred embodiment, too, same as in preferred embodiment 1, the basic structure is composed by overlaying upper board 1 as laminated board having cavity 11 on lower board 2 as laminated board. FIG. 8A to FIG. 8C are sectional views of circuit board showing the manufacturing method of circuit board in preferred embodiment 2 of the present invention. First, as shown in FIG. 8A, circuit board 20 formed at step in FIG. 4A, and connection sheet 3 between boards formed at step in FIG. 6H are prepared.

Next, after removing parting film 42b from one side of connection sheet 3 between boards, board 13 laminating and adhering connection sheet 3 between board on circuit board 20 is formed as upper board 1. Next, as shown in FIG. 8C, opening 9 of specific area is formed in a region including the central portion of board 13 by router processing or punching. Parting film 42a of board 13 is removed. This board is laminated to lower board 2 so as to contact with the side of connection sheet 3 between boards of this board. In the drawing, upper board 1 is turned upside down in the lamination. The following steps are same as the steps after FIG. 1D.

The manufacturing method of circuit board in this preferred embodiment has the following advantages. By adhering connection sheet 3 between boards not containing padding to upper board 1 in C-stage state, handling is easy in manufacturing process. Since connection sheet 3 between boards and the opening of upper board 1 can be formed at the same step, the productivity is enhanced. Further, same as in the case of FIG. 7, since connection sheet 3 between boards having parting film 42a can be temporarily bonded to the entire surface of upper board 1, deviation of position at the step of heat press can be prevented.

Figure 9:
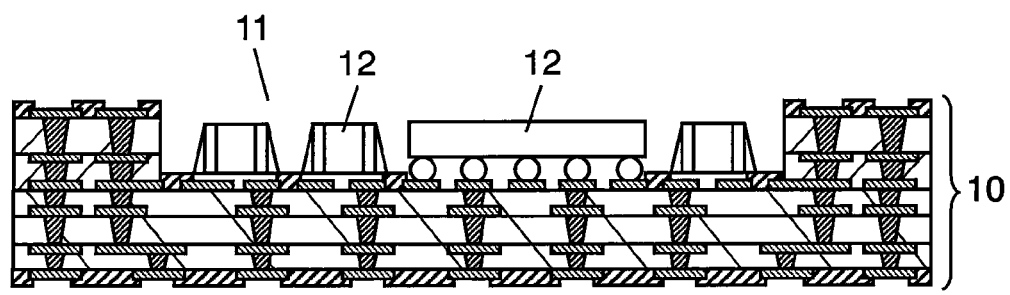
FIG. 9 is a sectional view of circuit board in preferred embodiment 2 of the present invention.
Figure 10A:
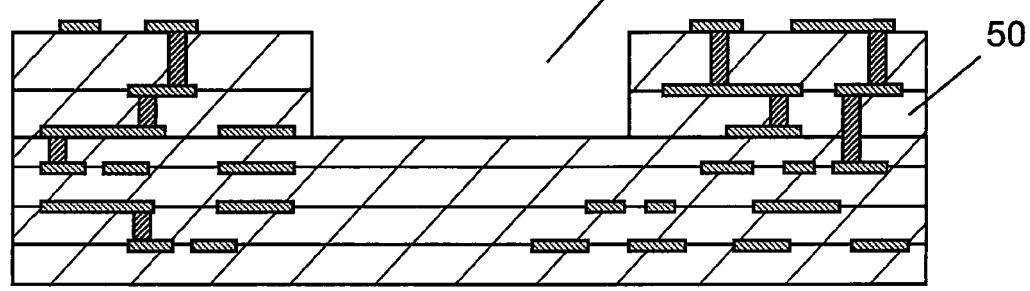
FIG. 10A is a sectional view of a conventional ceramic circuit board.
Figure 10B:
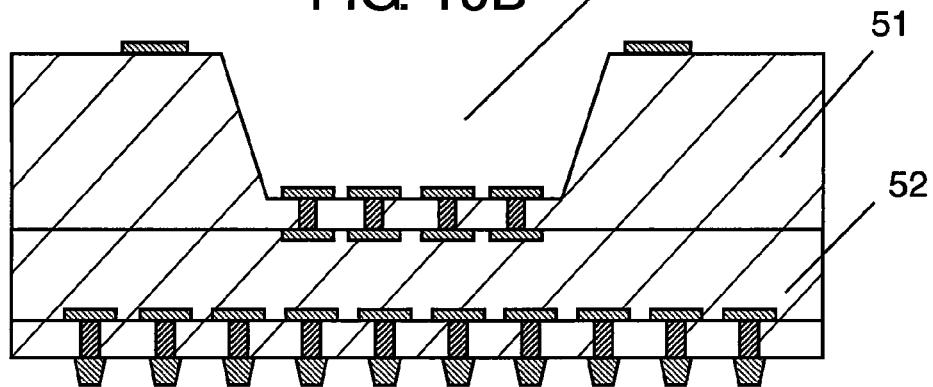
FIG. 10B is a sectional view of a conventional resin-made circuit board.

The circuit board of the present invention obtained in the manufacturing method explained in the preferred embodiment is formed in full-layer IVH structure as shown in FIG. 9, and has cavity 11 for mounting electronic component 12, and it can be mounted on a mother board such as multi-layer printed wiring board. In particular, a same board material as mother board can be selected for upper board 1 and lower board 2 for composing the circuit board of the present invention.

Connection sheet 3 between boards for connecting upper board 1 and lower board 2 is made of a material of which coefficient of thermal expansion in thickness direction is lower than that of the board, and warp can be suppressed, and reliability of mounting with mother board can be enhanced.

Moreover, since connection sheet 3 between boards is made of material of low fluidity, it is possible to prevent flow of resin into the inside of cavity 11, and deformation of conductive holes by fluidity of resin, and a full-layer IVH structure having high reliability of interlayer connection can be realized.

The manufacturing method of the circuit board of the present invention is free from firing process, spot facing process, or resin forming process, and concave dented cavity 11 can be formed easily and efficiently, and without changing the die or the like, a circuit board depending on the height of the electronic component to be mounted on cavity 11 can be presented.

In the preferred embodiment, two-layer circuit board 20 is used as upper board 1, and four-layer circuit board 30 is used as lower board 2, but the number of layers of upper board 1 and lower board 2 is not particularly specified.

Upper board 1 and lower board 2 are made of cured glass woven fabric base material impregnating epoxy resin, but not limited to glass woven fabric, for example, non-woven fabric such as aramid can be also used as base material. The resin to be impregnated is not limited to epoxy resin, and various resins can be selected depending on the specification of the circuit board as far as the purpose of the present invention is achieved in comparison of coefficient of thermal expansion in thickness direction of the material used in the connection sheet between boards.

The insulation coat film layer selectively formed on the surface of the upper board and the lower board is solder resist of photographic development type, but it is also possible to form by using, for example, insulation coat film material for layout of components such as road map. Not limited to photographic development type, for example, photosensitive film may be also used. Further, by using a metal plate or screen of trapezoidal shape in the section of ink permeation holes, a convex insulation coat film layer can be formed by printing method.

The step of laminating the materials such as board, metal foil or sheet explained in the preferred embodiment properly includes the process of laminating the positioning mark (or hole) on the material or board placed on a positioning stage by recognizing the position by CCD or other recognition device, and heating and pressing by heater punch, and bonding temporarily and fixing. The description is omitted for explaining simply.

The coefficients of thermal expansion in plane direction of upper board 1 and lower board 2 in the state having opening 5 are desired to be nearly equal. Being nearly equal, it is further possible to suppress deformation of conductive holes (via collapse) formed on connection sheet 3 between boards. Specifically, it is realized by setting the residual copper rate, number of layers, or thickness of upper board 1 and lower board 2 depending on the area of opening 5.

As adhesion layer 4, further, thermoplastic resin (polyphenylene sulfide PPS, polyether ether ketone PEEK, polyether sulfone PES) or thermoplastic polyimide or the like may be used. The required condition includes low coefficient of expansion, laser processing performance, or interlayer adhesion, same as or better than the condition of adhesion layer 4 of the connection sheet between boards shown in the preferred embodiments.

INDUSTRIAL APPLICABILITY

The present invention is intended to meet the recent demand for multiple layers and higher density of circuit board. The circuit board presented by the present invention is effective as a substitute technology for conventional LTCC (low temperature co-fired ceramics) board from the viewpoint of productivity, reliability, and manufacturing cost. It is suited to the mounting mode of using the multi-layer wiring board of laminated glass epoxy resin as mother board, and the industrial applicability of the present invention is significant.

The invention claimed is:

1. A circuit board comprising:
an upper board having an opening bounded by side surfaces of the upper board and forming a circuit and an insulation coat film layer on a surface layer of the upper board,
a lower board forming a circuit and an insulation coat film layer on a surface layer,
a connection sheet being a separate sheet from the upper board and the lower board, the both upper board and the lower board being stacked up by way of the connection sheet inserted between the boards having an opening, and
a cavity formed by the opening of the upper board and the opening of the connection sheet between layers,
wherein the upper board and the lower board are made of cured resin impregnated in a base material, and
the connection sheet between boards further includes an adhesion layer and a conductive hole for interlayer connection, the adhesion layer containing an inorganic filler and thermosetting resin, being cured in the thermosetting resin, the conductive hole being filled with a conductive paste,
the insulation coat film layer of the upper board covers both a substantially entire region of an upper surface of the surface layer excluding an entire surface of the circuit, and the side surfaces of the upper board which bound the opening of the upper board.

2. The circuit board of claim 1, wherein the end face of the opening of the connection sheet between boards is formed of a modified layer composed of a filler and a thermosetting resin modified by laser processing.

3. The circuit board of claim 1, wherein the insulation coat film layer is formed in convex shape at scattered spots on the stacking and adhering side of the connection sheet between boards with the upper board or the lower board, and pre-fitted into the adhesion layer of the connection sheet between boards.

4. The circuit board of claim 3, wherein the thermosetting resin for composing the insulating coat film layer is a same material as the adhesion layer of the connection sheet between boards.

5. The circuit board of claim 1,
wherein the coefficient of thermal expansion in thickness direction of material of the connection sheet between boards is lower than the coefficient of thermal expansion in thickness direction of the material for composing the upper board and the lower board.

* * * * *